United States Patent
Strader et al.

(10) Patent No.: US 11,984,570 B2
(45) Date of Patent: *May 14, 2024

(54) THERMAL MANAGEMENT AND/OR EMI MITIGATION MATERIALS INCLUDING COATED FILLERS

(71) Applicant: Laird Technologies, Inc., Chesterfield, MO (US)

(72) Inventors: Jason L. Strader, Cleveland, OH (US); John Song, Barrington, IL (US)

(73) Assignee: Laird Technologies, Inc., Chestefield, MO (US)

( * ) Notice: Subject to any disclaimer, the term of this patent is extended or adjusted under 35 U.S.C. 154(b) by 22 days.

This patent is subject to a terminal disclaimer.

(21) Appl. No.: 17/882,328

(22) Filed: Aug. 5, 2022

(65) Prior Publication Data

US 2022/0376322 A1 Nov. 24, 2022

Related U.S. Application Data

(63) Continuation of application No. 16/811,684, filed on Mar. 6, 2020, now Pat. No. 11,411,263.
(Continued)

(51) Int. Cl.
*H01M 10/653* (2014.01)
*C04B 14/06* (2006.01)
(Continued)

(52) U.S. Cl.
CPC .......... *H01M 10/653* (2015.04); *C04B 14/06* (2013.01); *H01M 10/658* (2015.04);
(Continued)

(58) Field of Classification Search
CPC ... C04B 14/06; H01L 23/3737; H01L 23/552; H01M 10/653; H01M 10/658;
(Continued)

(56) References Cited

U.S. PATENT DOCUMENTS

| 2,541,851 A | 2/1951 | Wright |
| 5,011,870 A | 4/1991 | Peterson |

(Continued)

FOREIGN PATENT DOCUMENTS

| CN | 202503082 U | 10/2012 |
| CN | 103053230 A | 4/2013 |

(Continued)

OTHER PUBLICATIONS

Chinese Office Action and its English machine translation issued for CN202010151523.1 that claims priority to the same parent application as the instant application.

*Primary Examiner* — Victoria H Lynch
(74) *Attorney, Agent, or Firm* — Harness, Dickey & Pierce, P.L.C.; Anthony G. Fussner

(57) ABSTRACT

Disclosed are exemplary embodiments of thermal management and/or electromagnetic interference (EMI) mitigation materials including coated fillers (e.g., coated thermally-conductive, electrically-conductive, dielectric absorbing, and/or electromagnetic wave absorbing particles, sand particles coated with a binder, other coated functional fillers, combinations thereof, etc.). For example, a thermal management and/or EMI mitigation material may comprise a thermal interface material (TIM) including one or more coated fillers (e.g., coated thermally-conductive particles, sand particles coated with a binder, etc.), whereby the TIM is suitable for providing a thermal management solution for one or more batteries and/or battery packs (e.g., a battery pack for electric vehicle, etc.), or other device(s), etc.

29 Claims, 4 Drawing Sheets

Related U.S. Application Data

(60) Provisional application No. 62/908,289, filed on Sep. 30, 2019, provisional application No. 62/908,284, filed on Sep. 30, 2019, provisional application No. 62/814,605, filed on Mar. 6, 2019, provisional application No. 62/814,610, filed on Mar. 6, 2019.

(51) Int. Cl.
| | |
|---|---|
| *H01M 10/658* | (2014.01) |
| *H01M 50/124* | (2021.01) |
| *H01M 50/204* | (2021.01) |
| *H01M 50/233* | (2021.01) |
| *H01M 50/293* | (2021.01) |
| *H05K 9/00* | (2006.01) |

(52) U.S. Cl.
CPC ..... *H01M 50/124* (2021.01); *H01M 50/1245* (2021.01); *H01M 50/204* (2021.01); *H01M 50/233* (2021.01); *H01M 50/293* (2021.01); *H05K 9/0045* (2013.01)

(58) Field of Classification Search
CPC ........... H01M 50/124; H01M 50/1245; H01M 50/204; H01M 50/233; H01M 50/293; H05K 9/0045; H05K 9/0083; Y02T 10/70
See application file for complete search history.

(56) References Cited

U.S. PATENT DOCUMENTS

| | | | |
|---|---|---|---|
| 5,023,075 | A | 6/1991 | Macchio et al. |
| 6,040,362 | A | 3/2000 | Mine et al. |
| 6,096,414 | A | 8/2000 | Young |
| 7,550,097 | B2 | 6/2009 | Tonapi et al. |
| 7,592,383 | B2 | 9/2009 | Fukui |
| 7,786,056 | B2 | 8/2010 | Matsumoto et al. |
| 7,862,894 | B2 | 1/2011 | Modell et al. |
| 7,968,624 | B2 | 6/2011 | Fornes et al. |
| 8,597,813 | B2 | 12/2013 | Murasato et al. |
| 9,403,115 | B2 | 8/2016 | Majumder et al. |
| 10,087,351 | B2 | 10/2018 | Bruzda et al. |
| 10,122,003 | B2 | 11/2018 | Hoshino |
| 11,411,263 | B2 | 8/2022 | Strader et al. |
| 2004/0242762 | A1 | 12/2004 | Horikoshi et al. |
| 2010/0255359 | A1 | 10/2010 | Hirakawa et al. |
| 2014/0120399 | A1* | 5/2014 | Balandin ............ H01M 10/653 252/74 |
| 2014/0146477 | A1 | 5/2014 | Youn |
| 2014/0166909 | A1 | 6/2014 | Onizawa |
| 2016/0067126 | A1 | 3/2016 | Purdy et al. |
| 2016/0168037 | A1* | 6/2016 | Chu ........................ C08K 3/04 264/129 |
| 2016/0226115 | A1 | 8/2016 | Wakida et al. |
| 2016/0260135 | A1 | 9/2016 | Zomet et al. |
| 2016/0343531 | A1 | 11/2016 | Douglass et al. |
| 2018/0044480 | A1* | 2/2018 | Shen ..................... C08G 77/62 |

FOREIGN PATENT DOCUMENTS

| | | | | |
|---|---|---|---|---|
| CN | 104893370 A | | 9/2015 | |
| DE | 3643668 A1 | | 5/1988 | |
| JP | 2012220154 A | | 11/2012 | |
| WO | WO-0121393 A1 | * | 3/2001 | ......... H01L 23/3737 |

* cited by examiner

THERMAL MANAGEMENT AND/OR EMI MITIGATION MATERIALS INCLUDING COATED FILLERS

CROSS-REFERENCE TO RELATED APPLICATIONS

The present application is a continuation of U.S. patent application Ser. No. 16/811,684 filed Mar. 6, 2020 (published as US2020/0287253 on Sep. 10, 2020 and issuing as U.S. Pat. No. 11,411,263 on Aug. 9, 2022). U.S. patent application Ser. No. 16/811,684 claims priority to and the benefit of:
- U.S. Provisional Patent Application No. 62/814,605 filed Mar. 6, 2019;
- U.S. Provisional Patent Application No. 62/814,610 filed Mar. 6, 2019;
- U.S. Provisional Patent Application No. 62/908,284 filed Sep. 30, 2019; and
- U.S. Provisional Patent Application No. 62/908,289 filed Sep. 30, 2019.

The entire disclosures of the above patent applications are incorporated herein by reference.

FIELD

The present disclosure relates to thermal management and/or EMI (electromagnetic interference) mitigation materials including coated fillers (e.g., coated thermally-conductive, electrically-conductive, dielectric absorbing, and/or electromagnetic wave absorbing particles, sand particles coated a binder, other coated functional fillers, combinations thereof, etc.). For example, a thermal management and/or EMI mitigation material disclosed herein may comprise a thermal interface material (TIM) including one or more coated fillers (e.g., coated thermally-conductive particles, sand particles coated with a binder, etc.), whereby the TIM is suitable for providing a thermal management solution for one or more batteries and/or battery packs (e.g., a battery pack for electric vehicle, etc.), or other device(s), etc.

BACKGROUND

This section provides background information related to the present disclosure which is not necessarily prior art.

Electrical components, such as semiconductors, integrated circuit packages, transistors, etc., typically have pre-designed temperatures at which the electrical components optimally operate. Ideally, the pre-designed temperatures approximate the temperature of the surrounding air. But the operation of electrical components generates heat. If the heat is not removed, the electrical components may then operate at temperatures significantly higher than their normal or desirable operating temperature. Such excessive temperatures may adversely affect the operating characteristics of the electrical components and the operation of the associated device.

To avoid or at least reduce the adverse operating characteristics from the heat generation, the heat should be removed, for example, by conducting the heat from the operating electrical component to a heat sink. The heat sink may then be cooled by conventional convection and/or radiation techniques. During conduction, the heat may pass from the operating electrical component to the heat sink either by direct surface contact between the electrical component and heat sink and/or by contact of the electrical component and heat sink surfaces through an intermediate medium or thermal interface material (TIM). The thermal interface material may be used to fill the gap between thermal transfer surfaces, in order to increase thermal transfer efficiency as compared to having the gap filled with air, which is a relatively poor thermal conductor.

In addition, a common problem in the operation of electronic devices is the generation of electromagnetic radiation within the electronic circuitry of the equipment. Such radiation may result in electromagnetic interference (EMI) or radio frequency interference (RFI), which can interfere with the operation of other electronic devices within a certain proximity. Without adequate shielding, EMI/RFI interference may cause degradation or complete loss of important signals, thereby rendering the electronic equipment inefficient or inoperable.

A common solution to ameliorate the effects of EMI/RFI is through the use of shields capable of absorbing and/or reflecting and/or redirecting EMI energy. These shields are typically employed to localize EMI/RFI within its source, and to insulate other devices proximal to the EMI/RFI source.

The term "EMI" as used herein should be considered to generally include and refer to EMI emissions and RFI emissions, and the term "electromagnetic" should be considered to generally include and refer to electromagnetic and radio frequency from external sources and internal sources. Accordingly, the term shielding (as used herein) broadly includes and refers to mitigating (or limiting) EMI and/or RFI, such as by absorbing, reflecting, blocking, and/or redirecting the energy or some combination thereof so that it no longer interferes, for example, for government compliance and/or for internal functionality of the electronic component system.

DRAWINGS

The drawings described herein are for illustrative purposes only of selected embodiments and not all possible implementations, and are not intended to limit the scope of the present disclosure.

Figure 5:
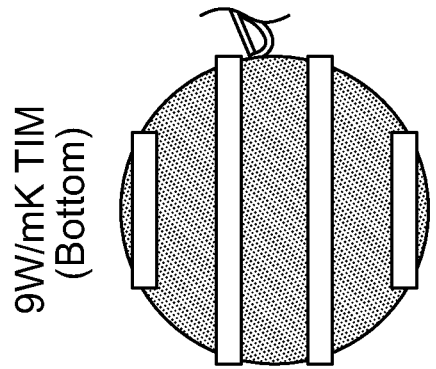
FIG. 5 illustrates a fourth test sample including aluminum strips and an exemplary embodiment of a thermal interface material along the bottom of the SS bar shown in FIG. 1.
Figure 6:
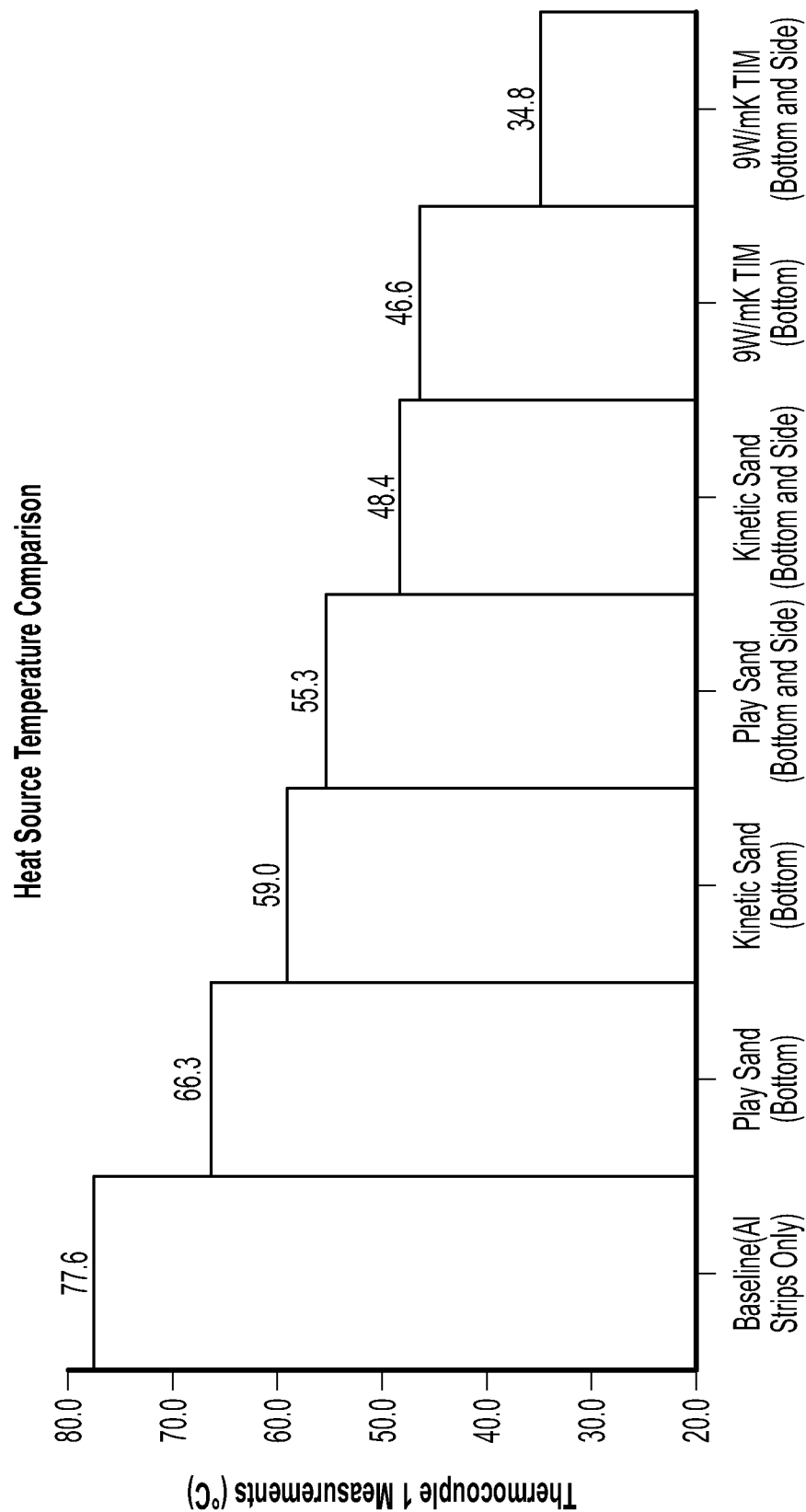

FIG. 6 includes a bar graph of heat source temperature comparison in degrees Celsius (° C.) for the four test samples shown in FIGS. 2-5 and three additional test samples.

Figure 7:
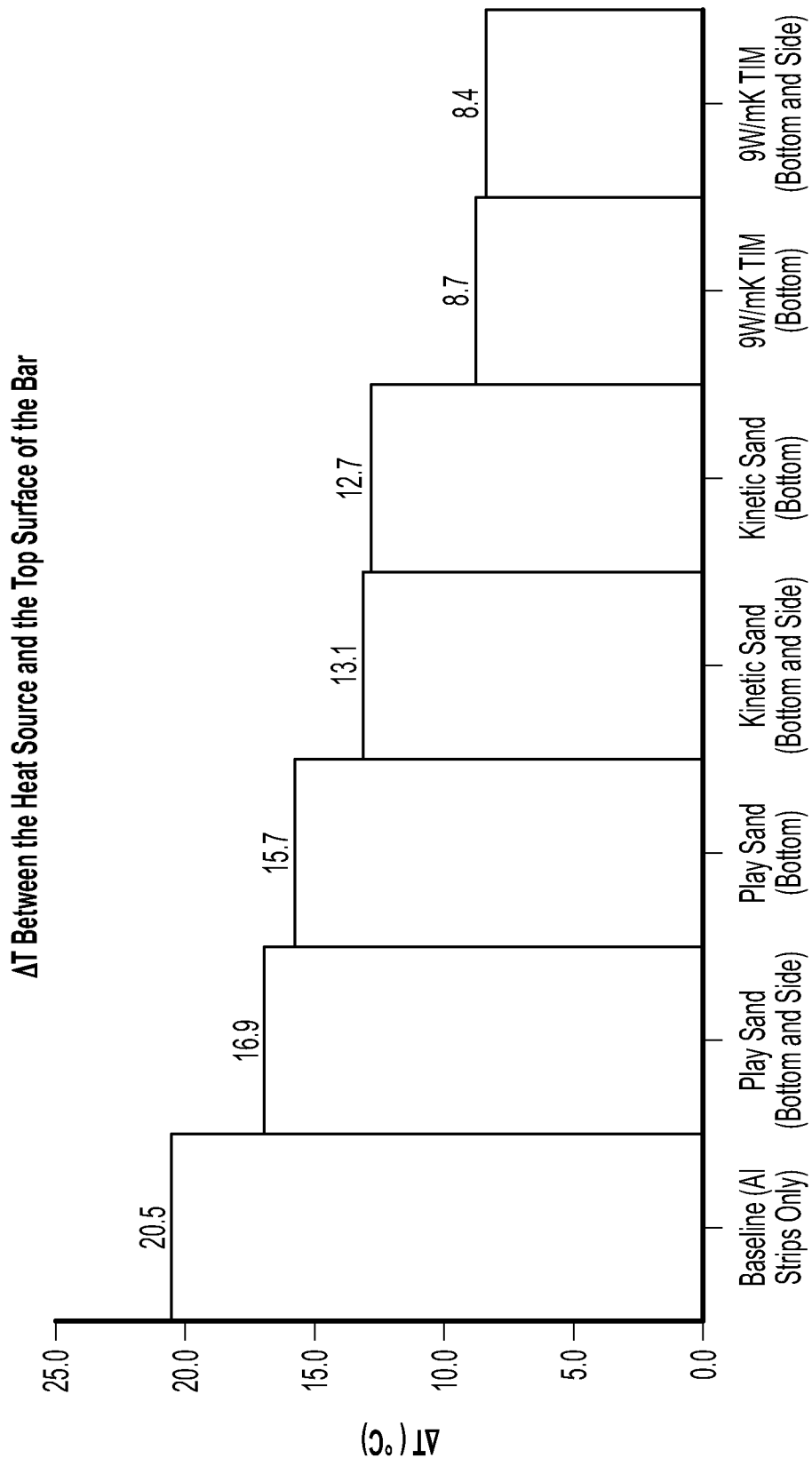

FIG. 7 includes a bar graph of delta temperature ($\Delta T$) in degrees Celsius (° C.) between the heat source and the top surface of the SS bar for the four test samples shown in FIGS. 2-5 and three additional test samples.

Corresponding reference numerals may indicate corresponding (but not necessarily identical) parts throughout the several views of the drawings.

DETAILED DESCRIPTION

Example embodiments will now be described more fully with reference to the accompanying drawings.

Increased performance of composites for thermal and/or electromagnetic energy management is achievable by higher loadings of functional fillers. An example of the state of the art for thermal interface materials (TIMs) used for thermal energy management is currently up to about 85 vol % (volume percent) of the functional thermally-conductive filler. Conventionally, however, increasing the filler loading tends to increase the hardness of the composite. And the increased hardness may be problematic when it is desirable for the TIMs to be soft, flexible, and deflectable so that the TIMs do not subject devices to high stress levels when used.

Disclosed herein are exemplary embodiments of thermal management and/or EMI mitigation materials that include coated functional fillers, such as thermally-conductive particles, electrically-conductive particles, dielectric absorbing particles, electromagnetic wave/magnetic absorbing particles, combinations thereof, etc. In exemplary embodiments, the coating on the functional filler preferably allows for increased or higher loadings of the functional filler (e.g., more than 85 vol %, at least about 90 vol % or more, up to about 98 vol %, etc.), which in turn, preferably allows for increased or improved performance (e.g., a higher thermal conductivity of at least about 9 W/mK, etc.) while maintaining an acceptable softness (e.g., Shore 00 harness less than about 85, etc.), flexibility, deflection, and/or moldability at the higher functional filler loading, etc.

In exemplary embodiments, the thermal management and/or EMI mitigation material includes functional filler particles and a coating (e.g., a binder, etc.) disposed as thin layers on the functional filler particles. For example, the coating may comprise a binder including hydroxyl-terminated polymer (e.g., silicone oil, etc.) cross-linked by a cross-linking agent (e.g., a boron crosslinking agent, etc.). In such exemplary embodiments, the thermal management and/or EMI mitigation material includes more than 85 vol % (e.g., at least about 90 vol % or more, up to about 98 vol %, etc.) of the functional filler particles coated with the binder.

As disclosed herein, the functional filler particles may comprise thermally-conductive particles (e.g., zinc oxide, boron nitride, alumina or aluminum oxide, aluminum, silicon nitride, aluminum nitride, iron, metallic oxides, graphite, silver, copper, ceramic, combinations thereof, etc.) and/or EMI absorbing particles (e.g., silicon carbide, carbonyl iron, manganese zinc ferrite, magnetic flakes, an alloy containing about 85% iron, 9.5% silicon and 5.5% aluminum, an alloy containing about 20% iron and 80% nickel, iron silicide, iron-chrome compounds, metallic silver, magnetic alloys, magnetic powders, magnetic particles, nickel-based alloys and powders, chrome alloys, combinations thereof, etc.).

In exemplary embodiments, a method of producing a thermal management and/or EMI mitigation material includes mixing functional filler particles and a coating (e.g., a binder, etc.). For example, the coating may comprise a binder including hydroxyl-terminated polymer (e.g., silicone oil, other hydroxyl-terminated polymer having low viscosity, etc.) cross-linked by a cross-linking agent (e.g., a boron crosslinking agent, etc.). In an exemplary embodiment, the method includes distributing silicone oil as thin layers on the surfaces of the functional filler particles and providing cross-linking agent (e.g., boron-containing cross-linking agent, etc.) such that cross-linking of the polymer takes place and viscosity increases. The functional filler particles may comprise aluminum oxide, zinc oxide, silicon carbide, carbonyl iron, other thermally-conductive, electrically-conductive, dielectric absorbing, and/or electromagnetic wave absorbing particles, combinations thereof, etc.).

In exemplary embodiments, the thermal management and/or EMI mitigation material comprises a thermal interface material (TIM) including thermally-conductive particles coated with binder (broadly, a coating). The binder includes hydroxyl-terminated polymer (e.g., silicone oil, other hydroxyl-terminated polymer having low viscosity, etc.) cross-linked by a cross-linking agent (e.g., a boron crosslinking agent, etc.). For example, silicone oil may be distributed as thin layers on the surfaces of thermally-conductive particles. Cross-linking of the polymer may then take place via a cross-linking agent (e.g., boron-containing cross-linking agent, etc.). In such exemplary embodiments, the thermal interface material may include more than 85 vol % (e.g., about 90 vol %, up to about 98 vol %, etc.) of the coated thermally-conductive particles, which may thereby provide an enhanced thermally-conductive composite with superior properties over the state-of the art known today.

Some exemplary embodiments also include controlling particle size of the functional fillers, e.g., to control hardness and/or maintain softness, etc. Such exemplary embodiments may provide a high thermal conductivity, easily flexed, and easily deflectable TIM. By way of example, particle size of the functional fillers may be controlled such that the particle size is within a range from about 0.01 microns to about 1000 microns and/or such that the thermal management and/or EMI mitigation material has a Shore 00 hardness less than about 85. In an exemplary embodiment, particle size of the functional fillers was controlled such that the particle size was within a range from about 0.01 microns to about 400 microns, and the thermal management and/or EMI mitigation material had a Shore 00 hardness less than 85 and a thermal conductivity of at least about 9 W/mK (e.g., at least about 9.2 W/mK, etc.).

In other exemplary embodiments, the thermal management and/or EMI mitigation materials comprise electrically-conductive elastomers (EcE), ferrites, microwave absorbers, hybrid absorber/thermal/EcE/ferrite materials having multiple functionalities, etc. that include functional fillers coated with binder as disclosed herein. Accordingly, aspects of the present disclosure should not be limited to any one particular type of thermal management and/or EMI mitigation material.

In exemplary embodiments, methods for producing or making enhanced functional composites include coating thermally-conductive, electrically-conductive, dielectric absorbing, and/or electromagnetic wave absorbing fillers such that the particles adhere well together and may be formed into a predetermined or desirable shape while maintaining relative softness and deflection. Exemplary embodiments allow thermal interface materials to have increased thermal conductivity of at least 9 W/mK or more (e.g., at least about 9.2 W/mK, etc.) while maintaining desirable physical properties disclosed herein. Improved EMI management and/or hybrid performance is also achieved in exemplary embodiments.

In exemplary embodiments, the thermal management and/or EMI mitigation materials are configured to generally hold a basic shape (e.g., generally spherical shape, generally conical shape, generally cylindrical shape, generally cuboidal shape, generally rectangular prism shape, generally toroidal shape, other basic three-dimensional geometric shape, etc.) when formed into the basic shape and include thin layer coatings on the functional filler particles. Advantageously, the thermal management and/or EMI mitigation materials disclosed herein may be adaptable to different assembly fixture shapes unlike conventional materials that have a predetermined shape using cured elastomer.

In exemplary embodiments, a material composition includes functional filler particles that are surrounded by a coating or binder layer and adhere to one another. Relatively small gaps (e.g., air pockets, etc.) are located or defined between adjacent particles in exemplary embodiments. Accordingly, the material composition including the functional filler particles coated with the binder does not necessarily form a single contiguous, homogenous, or unbroken mass. Nonetheless, the functional filler particles coated with the binder preferably comprise a significant majority of the total volume, e.g., within a range from about 85 vol % to about 98 vol % (e.g., about 90 vol %, about 98 vol %, greater than 85 vol %, etc.). In an exemplary embodiment, the material composition includes about 98 vol % of functional filler particles coated with binder and 2 vol % of matrix material (e.g., polymer, silicone elastomer, etc.). In some exemplary embodiments, having a lower thermal conductivity but a very high filler loading allows for reduction in the cost of the composite as polymer may be the highest cost component in general. Additionally, some exemplary embodiments are configured such that the EMI performance may be improved over the current state of the art at lower thermal conductivities as well.

The functional filler particles may vary in size, e.g., from about 0.01 microns to about 1000 microns, from about 0.01 microns to about 400 microns, etc. The shape(s) of the functional filler particles may also vary, e.g., round, spherical, flakes, rods, irregular, granular, cubic, aggregated, etc. In exemplary embodiments, the functional filler particles are configured such that no surface primer or surface modification is needed for adhering the binder to the surfaces of the functional filler particles. In other exemplary embodiments, the functional filler particles undergo surface modification or an application of a surface primer to allow the binder to adhere to the surfaces of the functional filler particles.

In exemplary embodiments, a binder forms layer coatings along surfaces of the functional filler particles where the binder layer/coating thickness (e.g., less than about 100 microns, etc.) is thin enough to not significantly alter functional properties (e.g., thermal and/or electrical conductivity, etc.) of the functional filler particles. The binder layer/coating thickness may vary in exemplary embodiments, such as from about 0.01 microns to about 100 microns (e.g., about 0.5 microns to 5 microns, about 1 microns to 2 microns, etc.). In exemplary embodiments, filler (e.g., powder, etc.) may be mixed into polymer matrix, such that the mixture has a fluid or putty like consistency.

In exemplary embodiments, the binder includes hydroxy-terminated polymer and a cross-linking agent. The polymer chains are interconnected such that the viscosity of the binder is higher than the hydroxy-terminated polymer. The ends of the hydroxy-terminated polymer have OH groups. The cross-linking agent may include H+ ions that react with the OH groups at the ends of hydroxy-terminated polymer under hydrolysis.

The binder may comprise various hydroxy-terminated polymers (e.g., silicone oil, etc.) having different viscosities. Examples that may be used in exemplary embodiments include hydroxy-terminated silicone oil having a viscosity of 750 centipoises (cP), hydroxy-terminated silicone oil having a viscosity of 100 cP, etc.

In exemplary embodiments, the binder further includes hydroxy-containing polymer, such as hydrogenated ricin oil, etc. In such exemplary embodiments, the hydroxy-containing polymer includes OH groups that may react with the cross-linking agent. With the hydroxy-containing polymer, the OH groups may be at the ends and/or located elsewhere.

In exemplary embodiments, boric acid is used as the cross-linking agent. Other cross-linking agents may also be used, such as other boric compounds (e.g., boric acid anhydride $B_2O_3$, etc.), etc. Accordingly, various cross-linkable polymers and suitable cross-linking agents may be included in the binder in exemplary embodiments.

In exemplary embodiments, the material composition including the functional filler particles coated with binder is heated, e.g., up to about 120 degrees Celsius in an oven for curing the polymer/binder, etc. The heating may help remove moisture absorbed by the material composition. The material composition is preferably configured such that material composition does not set if left unworked after the heating process, which may provide an advantage of not having to knead the material composition while the heated material composition cools.

In exemplary embodiments, one or more additives may optionally be added to the binder in order to improve or vary one or more of the binder's properties. For example, a plasticizer (e.g., stearic acid, oleic acid in liquid form at room temperature, etc.) may be added for lubrication between the polymer chains included in the binder and/or for imparting a different consistency to the material composition. A tack reducing agent may be used, such as a highly viscous paraffin oil in semi-solid phase, tensides, glycols, etc. A pigment(s) may be added to modify the color.

Accordingly, an exemplary embodiment of a method includes adding functional filler particles that are to be coated with a binder into a mixer, and adding hydroxy-terminated polymer (e.g., a hydroxyl-terminated silicone oil, etc.) into the mixer. Optional additives may be added into the mixer, such as one or more color pigments, plasticizers, tack reducers, etc. The mixer is then operated such that the hydroxy-terminated polymer and possible other optional additives are mixed and distributed (e.g., homogeneously, uniformly, etc.) to form thin layers on the functional filler particles. The contents within the mixer may be heated to raise the temperature (e.g., up to about 120° C., etc.) to remove moisture.

Cross-linking agent (e.g., boric acid dissolved in water, etc.) is added into the mixer. The cross-linking agent reacts with the hydroxy-terminated polymer to form a finished, viscous binder. For example, boric acid may be added into the mixer such that the boric acid is distributed substantially uniformly in the material composition before the reaction takes place, whereby the resultant binder is substantially homogeneously distributed on the functional filler particles. The mixer is closed while the cross-linking agent is distributed substantially uniformly in the mixer. The solubility of the cross-linking agent in water may increase with the temperature, and the cross-linking agent may be present in aqueous solution during the distribution in the mixer. In this example, the reaction between the cross-linking agent in the form of boric acid and the hydroxy-terminated polymer is a hydrolysis, whereby water departs as a reaction product. The hydrogen ions included in the boric acid and the OH groups in the hydroxy-terminated polymer form the water molecules.

When a substantial homogeneous distribution of the cross-linking agent has been achieved, the material composition may be transferred from the mixer to a slower mixer for kneading and de-airing. Steam and heat may depart after the mixer is opened, whereupon the material composition cools. With the departure of steam and the falling temperature, the cross-linking agent is released and a reaction with the hydroxy-terminated polymer takes place gradually with hydrolysis and substantially homogenously in the material composition. The viscosity may then gradually increase and a substantially uniform layer (e.g., 0.1 microns to 10 microns thick, etc.) of the binder is formed on the functional filler particles.

In exemplary embodiments, the functional filler particles do not have absolutely smooth surface structures, which helps adherence of the coating or binder thereon. For example, the coating or binder may adhere sufficiently well to the functional filler particles even though the coating or binder may not have strong adhesive properties. In some exemplary embodiments, the function filler particles may have relatively smooth surfaces that may be surface treated or modified (e.g., surface coated, etc.) to improve adhesion with the coating or binder.

In alternative exemplary embodiments, the order in which cross-linking agent (e.g., boric acid, etc.) and hydroxy-terminated polymer are added to the mixer may be reversed. In such alternative embodiments, the cross-linking agent and the hydroxy-terminated polymer are distributed substantially uniformly on the functional filler particles while in a relatively low viscous state. The contents in the mixer may be heated after both the cross-linking agent and then the hydroxy-terminated polymer have been added to the mixer and substantially uniformly spread on the functional filler particles.

Accordingly, disclosed herein are exemplary embodiments of thermal management and/or electromagnetic interference (EMI) mitigation materials that comprise functional filler coated with a coating (e.g., binder, etc.). The coating may comprise a binder that includes hydroxyl-terminated polymer cross-linked by cross-linking agent; and/or the functional filler is thermally conductive, electrically conductive, dielectric absorbing, and/or electromagnetic wave absorbing. The thermal management and/or EMI mitigation material may be granular, may have a consistency similar to wet sand, and/or may be configured to generally hold a basic shape when formed into the basic shape. For example, the thermal management and/or EMI mitigation material may be formed into and then hold a basic shape, such as a sphere or generally spherical shape, a cone or generally conical shape, a cylinder or generally cylindrical shape, a cube or generally cuboidal shape, a rectangular prism or generally rectangular prism shape (e.g., a pad, etc.), a toroid or generally toroidal shape (e.g., doughnut, etc.), other basic three-dimensional geometric shape, etc.

In some exemplary embodiments, the hydroxyl-terminated polymer comprises silicone oil; and/or the cross-linking agent comprises boron. The functional filler comprises functional filler particles that are thermally conductive, electrically conductive, dielectric absorbing, and/or electromagnetic wave absorbing. The binder defines a thin layer coating along surfaces of the functional filler particles. The thin layer coating defined by the binder along the surfaces of the functional filler particles preferably has a thickness (e.g., less than about 10 microns, etc.) such that the thin layer coating does not significantly alter the thermally-conductive, electrically-conductive, dielectric absorbing, and/or electromagnetic wave absorbing property(ies) of the functional filler particles. The thermal management and/or EMI mitigation material is preferably moldable, formable, and/or dispensable. The binder may be configured to increase a maximum functional filling loading for the thermal management and/or EMI mitigation material to at least about 90 vol % (e.g., about 98 vol %, etc.).

In some exemplary embodiments, the thermal management and/or EMI mitigation material has a thermal conductivity of at least 9 W/mK or more (e.g., at least about 9.2 W/mK, etc.), includes more than 85 vol % (e.g., at least about 90 vol %, at least about 98 vol %, etc.) of the functional filler coated with the binder, and the thermal management and/or EMI mitigation material has a Shore 00 hardness less than 85. The functional filler comprises one or more of: thermally-conductive particles, electrically-conductive particles, dielectric absorbing particles, electromagnetic wave absorbing particles, and particles that are two or more of thermally conductive, electrically conductive, dielectric absorbing, and electromagnetic wave absorbing.

In some exemplary embodiments, the functional filler comprises thermally-conductive particles including one or more of zinc oxide, boron nitride, alumina or aluminum oxide, aluminum, silicon nitride, aluminum nitride, iron, metallic oxides, graphite, silver, copper, ceramic, aluminum hydroxide, silica, silicon carbide, silicon, titania, and/or combinations thereof.

In some exemplary embodiments, the functional filler comprises EMI absorbing particles including one or more of silicon carbide, carbonyl iron, manganese zinc ferrite, magnetic flakes, an alloy containing about 85% iron, 9.5% silicon and 5.5% aluminum, an alloy containing about 20% iron and 80% nickel, iron silicide, iron-chrome compounds, metallic silver, magnetic alloys, magnetic powders, magnetic particles, nickel-based alloys and powders, chrome alloys, and/or combinations thereof.

In some exemplary embodiments, the functional filler comprises different grades of the same functional filler particles or different grades of different types of functional filler particles.

In some exemplary embodiments, the thermal management and/or EMI mitigation material comprises a thermal interface material, electrically-conductive elastomer, ferrite, an EMI absorber, an EMI shielding material, a thermally-conductive electrical conductor, a thermally-conductive dielectric material, a thermally-conductive EMI absorber, a thermally-conductive EMI suppression material, and/or electrically-conductive thermal insulator.

In some exemplary embodiments, the thermal management and/or EMI mitigation material comprises a thermally-conductive microwave absorber, and the functional filler particles comprise silicon carbide, carbonyl iron powder, and alumina. Or the thermal management and/or EMI mitigation material comprises a thermally-conductive microwave absorber, and the functional filler particles comprise silicon carbide, carbonyl iron powder, alumina, manganese zinc ferrite, and magnetic flake. Or the functional filler comprises alumina, silicon carbide, and carbon black.

In some exemplary embodiments, the thermal management and/or EMI mitigation material comprises a polymeric binder/matrix loaded with the functional filler coated with the coating. The polymeric binder/matrix includes a silicone based material, a hydrocarbon based material, and/or an epoxy based material.

The thermal management and/or EMI mitigation material may be configured to be positionable under, around, and/or alongside one or more batteries, a battery pack, and/or other device whereat the thermal management and/or EMI mitigation material is operable as a fire suppressant if the one or more batteries, battery pack, and/or other device catches fire. The thermal management and/or EMI mitigation material may be operable to help suppress the fire and inhibit or prevent the fire from spreading.

In some exemplary embodiments, a device includes at least one thermal management and/or EMI mitigation material as disclosed herein. The at least one thermal management and/or EMI mitigation material may be positioned relative to, against, and/or adjacent one or more heat sources of the device and one or more heat removal/dissipation structures of the device such that the at least one thermal management and/or EMI mitigation material is operable for defining or establishing at least part of a thermally-conductive heat path generally between the one or more heat sources and the one or more heat removal/dissipation structures along which heat is transferrable. Additionally, or alternatively, the at least one thermal management and/or EMI mitigation material may be positioned relative to, against, and/or adjacent one or more components of the device such that the at least one thermal management and/or EMI mitigation material is operable for providing EMI mitigation for the one or more components of the device. The at least one thermal management and/or EMI mitigation material may also or alternatively be positioned relative to, against, and/or adjacent one or more components of the device such that the at least one thermal management and/or EMI mitigation material is operable as a fire suppressant if the one or more components catch fire, whereby the thermal management and/or EMI mitigation material may be operable to help suppress the fire and inhibit or prevent the fire from spreading.

Also disclosed herein are exemplary embodiments of methods relating to material compositions including functional filler and suitable for use as a thermal management and/or EMI mitigation material. In exemplary embodiments, a method comprises coating the functional filler with a coating (e.g., a binder, etc.). The coating may comprise a binder including hydroxyl-terminated polymer cross-linked by cross-linking agent. The functional filler may be thermally conductive, electrically conductive, dielectric absorbing, and/or electromagnetic wave absorbing.

In some exemplary embodiments, the hydroxyl-terminated polymer comprises silicone oil. The cross-linking agent comprises boron.

In some exemplary embodiments, the method includes adding the functional filler into a mixer; adding the hydroxyl-terminated polymer into the mixer and distributing the hydroxyl-terminated polymer as thin layers on surfaces of the functional filler; adding cross-linking agent in solution or dissolved form into the mixer; and mixing via the mixer such that the polymer is cross-linked.

In some exemplary embodiments, the method may also include raising the temperature of the material composition; and/or surface modifying the functional filler to improve adhesion to the binder; and/or kneading and de-airing the material composition after the cross-linking agent has been supplied.

In some exemplary embodiments, coating the functional filler with the coating increases a maximum functional filling loading of the material composition to at least about 90 vol % (e.g., at least about 98 vol %, etc.).

In some exemplary embodiments, the functional filler comprises one or more of: thermally-conductive particles, electrically-conductive particles, dielectric absorbing particles, electromagnetic wave absorbing particles, and particles that are two or more of thermally conductive, electrically conductive, dielectric absorbing, and/or electromagnetic wave absorbing.

In some exemplary embodiments, the material composition comprises a thermal interface material, electrically-conductive elastomer, ferrite, an EMI absorber, an EMI shielding material, a thermally-conductive electrical conductor, a thermally-conductive dielectric material, a thermally-conductive EMI absorber, a thermally-conductive EMI suppression material, and/or electrically-conductive thermal insulator.

In some exemplary embodiments, the method includes positioning and/or using the material composition within a device, such that the material composition is operable for defining or establishing at least part of a thermally-conductive heat path generally between one or more heat sources of the device and one or more heat removal/dissipation structures of the device along which heat is transferrable; and/or such that the material composition is operable for providing EMI mitigation for one or more components of the device; and/or such that the material composition is operable as a fire suppressant if one or more batteries, a battery pack, or other component(s) of the device catch fire, whereby the material composition may be operable to help suppress the fire and inhibit or prevent the fire from spreading.

In some exemplary embodiments, the method includes positioning the material composition under, around, and/or alongside one or more batteries, a battery pack, and/or other device whereat the material composition is operable as a fire suppressant if the one or more batteries, battery pack, and/or other device catches fire, whereby the material composition may be operable to help suppress the fire and inhibit or prevent the fire from spreading.

An exemplary embodiment of a thermal management and/or EMI mitigation material including coated functional filler as disclosed herein may be used as a cooling medium, thermal interface material (TIM), and/or a thermal management solution for batteries/battery packs (e.g., electric vehicle (EV) battery packs, etc.). For example, the thermal management and/or EMI mitigation material may be positioned under, around, and/or alongside one or more batteries, a battery pack (e.g., a battery pack for an electric vehicle, etc.), or other device. In this example, the thermal management and/or EMI mitigation material may be operable as a fire suppressant in the event the battery(ies) (or other device being cooled) overheats and catches fire. In which case, the thermal management and/or EMI mitigation material may then help to suppress the fire and inhibit or prevent the fire from spreading, e.g., from one battery to another battery, etc.

Battery packs for electric vehicles should maintain a certain temperature for better efficiency. To help maintain temperature, hard rubber or foam thermal interface materials (TIMs) are conventionally used. But these conventional hard rubber or foam TIMs have relatively low thermal conductivity and have issues with taking up the necessary tolerances thereby leaving air gaps and trapped air, which, in turn, causes poor thermal performance. For example, the bottom of a battery pack may have up to a 1 millimeter (mm) variation, which results in air gaps and trapped air causing poor thermal performance when using conventional hard rubber or foam TIMs.

Disclosed herein are exemplary embodiments of thermal management solutions for batteries/battery packs (e.g., electric vehicle (EV) battery packs, etc.) utilizing a thermal management and/or EMI mitigation material (e.g., a thermal interface material (TIM), etc.) including coated functional filler (e.g., sand particles coated with a binder, thermally-conductive particles coated with a binder, etc.).

In exemplary embodiments, the thermal management and/or EMI mitigation material is a thermal interface material (TIM) that comprises sand coated with a coating (e., a binder, etc.). The coating may comprise binder including a hydroxyl-terminated polymer (e.g., silicone oil, etc.) cross-linked by a cross-linking agent (e.g., a boron compound, etc.). In some exemplary embodiments, the TIM may also include one or more fillers in addition to or as an alternative to sand, which one or more fillers may or may not be coated with the same coating (e.g., binder, etc.) as the sand.

In exemplary embodiments, the thermal management and/or EMI mitigation material (e.g., a TIM, etc.) including the coated functional filler (e.g., sand particles coated with a binder, thermally-conductive particles coated with a binder, etc.) may be positioned under, around, and/or alongside one or more batteries, a battery pack (e.g., a battery pack for an electric vehicle, etc.), or other device. For example, the thermal management and/or EMI mitigation material including the coated functional filler may be used to fill the void(s) along a bottom of a battery pack and thereby displace air resulting in improved heat transfer at a relatively low cost. The thermal management and/or EMI mitigation material including the coated functional filler may be dispensed onto an area (e.g., on top of a cooling plate, heat sink, other heat removal/dissipation structure or component, etc.) on which the battery pack will be placed. The battery pack may be placed on top of the bed or support surface defined by the thermal management and/or EMI mitigation material including the coated functional filler, which will take up tolerances and conform against the bottom surface of the battery pack or batteries, thereby forcing or pushing out air resulting in improved heat transfer.

Should the battery pack need to be replaced, the battery pack may be relatively easily lifted up or pulled off the thermal management and/or EMI mitigation material including the coated functional filler, which tends to be non-sticky, non-tacky, or non-adhesive. If any residual thermal management and/or EMI mitigation material including the coated functional filler remains on the battery pack, the residual thermal management and/or EMI mitigation material including the coated functional filler may be easily brushed off the battery pack. Before the replacement battery pack is installed, the remaining thermal management and/or EMI mitigation material including the coated functional filler from where the battery pack was removed may be smoothed out and/or more thermal management and/or EMI mitigation material including the coated functional filler may be added to help ensure good thermal contact (e.g., with little to no air gaps, etc.) between the bottom of the battery pack and the thermal management and/or EMI mitigation material including the coated functional filler.

Conventional TIMs for electric vehicle battery packs tend to be stiff and hard to deflect pads or sponges having many air voids, thus resulting in poor thermal contact and low heat transfer. Additionally, such conventional TIMs may tear when attempting to rework or reuse the TIM, which also reduces thermal performance. In exemplary embodiments disclosed herein, the thermal management and/or EMI mitigation material including the coated functional filler is conformable to surfaces. When the thermal management and/or EMI mitigation material including the coated functional filler is installed between a battery pack and a cooling plate, the conformability of the thermal management and/or EMI mitigation material including the coated functional filler allows the thermal management and/or EMI mitigation material including the coated functional filler to push or force air out from between the battery pack and the cooling plate, thereby providing better heat transfer. Regarding rework, the thermal management and/or EMI mitigation material including the coated functional filler may be swept away, reformed or resmoothed to be flat, or additional thermal management and/or EMI mitigation material including the coated functional filler may be added on top of the existing or remaining thermal management and/or EMI mitigation material including the coated functional filler to allow for fast and easy change out of a faulty battery/battery pack.

Accordingly, exemplary embodiments of thermal management and/or EMI mitigation material (e.g., thermal interface materials, etc.) including coated functional filler (e.g., sand particles coated with a binder, thermally-conductive particles coated with a binder, etc.) as disclosed herein are suitable for providing thermal management solutions for batteries/battery packs (e.g., battery packs for electric vehicles, etc.) and other devices, etc. The thermal management and/or EMI mitigation material may also be operable as a fire suppressant in the event the battery(ies) overheats and catches fire. In which case, the thermal management and/or EMI mitigation material may then help to suppress the fire and inhibit or prevent the fire from spreading, e.g., from one battery to another battery, etc.

In exemplary embodiments, a TIM comprises sand coated with a coating (e., a binder, etc.). The coating may comprise binder including a hydroxyl-terminated polymer (e.g., silicone oil, etc.) cross-linked by a cross-linking agent (e.g., a boron compound, etc.). In some exemplary embodiments, the TIM may also include one or more fillers in addition to or as an alternative to sand, which one or more fillers may or may not be coated with the same coating (e.g., binder, etc.) as the sand. In addition, or as an alternative to the sand particles, the filler may comprise thermally-conductive particles including one or more of zinc oxide, boron nitride, alumina, aluminum, silicon nitride, aluminum nitride, iron, metallic oxides, graphite, silver, copper, ceramic, and/or combinations thereof. The filler may comprise different grades of the same filler particles or different grades of different types of filler particles. The filler may be coated, if necessary, with a surface coating under the binder to improve adhesion with the binder.

In exemplary embodiments, a thermal management solution is provided for one or more batteries and/or battery packs. The thermal management solution includes a thermal interface material including filler coated with a coating (e.g., binder, etc.) as disclosed herein. The thermal interface material is positionable along a surface predesignated for the one or more batteries and/or battery packs. The thermal interface material may be operable for defining or establishing at least part of a thermally-conductive heat path with a portion of the one or more batteries and/or battery packs when the portion of the one or more batteries and/or battery packs are positioned on the thermal interface material. The thermal interface material may also be operable as a fire suppressant if the one or more batteries and/or battery packs catch fire to thereby help suppress the fire and inhibit or prevent the fire from spreading.

For example, the thermal interface material may be positioned along a surface predesignated for the battery pack, whereby the thermal interface material is operable for defining or establishing at least part of a thermally-conductive heat path generally between a portion of the battery pack and the surface predesignated for the battery pack when the portion of the battery pack is positioned on the thermal interface material. The surface predesignated for the battery pack may be an upper surface of a cooling plate within the electric vehicle. The thermal interface material may be positioned along the upper surface of the cooling plate, whereby the thermal interface material is operable for defining or establishing at least part of a thermally-conductive heat path generally between the cooling plate and the portion of the battery pack when the portion of the battery pack is positioned on the thermal interface material.

Also disclosed herein are exemplary embodiments of methods relating to thermal management of one or more batteries and/or battery packs. In exemplary embodiments, a method includes positioning a thermal interface material including filler coated with a coating (e.g., a binder, etc.) along a surface predesignated for the one or more batteries and/or battery packs. The thermal interface material may be operable for defining or establishing at least part of a thermally-conductive heat path with a portion of the one or more batteries and/or battery packs when the portion of the one or more batteries and/or battery packs are positioned on the thermal interface material. The thermal interface material may also be operable as a fire suppressant if the battery pack catches fire to thereby help suppress the fire and inhibit or prevent the fire from spreading.

The coating may comprise a binder that includes a hydroxyl-terminated polymer cross-linked by a cross-linking agent. The filler may comprise sand.

The surface predesignated for the one or more batteries and/or battery packs may be a surface predesignated for a battery pack of an electric vehicle. In which case, the step of positioning the thermal interface material includes positioning the thermal interface material along the surface predesignated for the battery pack of the electric vehicle, whereby the thermal interface material is operable for defining or establishing at least part of a thermally-conductive heat path generally between a portion of the battery pack and the surface predesignated for the battery pack when the portion of the battery pack is positioned on the thermal interface material.

The surface predesignated for the battery pack may be an upper surface of a cooling plate within the electric vehicle. In which case, the step of positioning the thermal interface material includes positioning the thermal interface material along the upper surface of the cooling plate, whereby the thermal interface material is operable for defining or establishing at least part of a thermally-conductive heat path generally between the cooling plate and the portion of the battery pack when the portion of the battery pack is positioned on the thermal interface material.

In exemplary embodiments, a thermal interface material includes sand coated with the coating (e.g., a binder, etc.). In such exemplary embodiments, the method may further include leveling, flattening, or smoothing out the sand coated with the coating along the surface predesignated for the one or more batteries and/or battery packs before placement of the one or more batteries and/or battery packs on the sand coated with the coating. Additionally, or alternatively, the method may include adding more sand coated with the coating along the surface predesignated for the one or more batteries and/or battery packs before placement of the one or more batteries and/or battery packs on the sand coated with the coating. Also in such exemplary embodiments, the method may include positioning the one or more batteries and/or battery packs on the sand coated with the coating such that the sand coated with the coating conforms against a surface of the one or more batteries and/or battery packs, thereby removing air gaps and improving heat transfer.

In exemplary embodiments, the filler comprises sand particles coated with a binder that comprises the hydroxyl-terminated polymer cross-linked by the cross-linking agent. The hydroxyl-terminated polymer comprises silicone oil; and/or the cross-linking agent comprises boron.

The filler preferably comprises thermally-conductive particles having a thermal conductivity greater than air. The binder preferably defines a thin layer coating (e.g., less than about 10 microns thick, etc.) along surfaces of the thermally-conductive particles. The thermal interface material is preferably moldable and conformable against surfaces. The thermal interface material may include at least about 90 vol % (e.g., at least about 98 vol %, etc.) of the filler coated with the binder. For example, the thermal interface material may include at least about 90 vol % (e.g., at least about 98 vol %, etc.) of sand coated with the binder and have a thermal conductivity greater than air.

Figure 1:
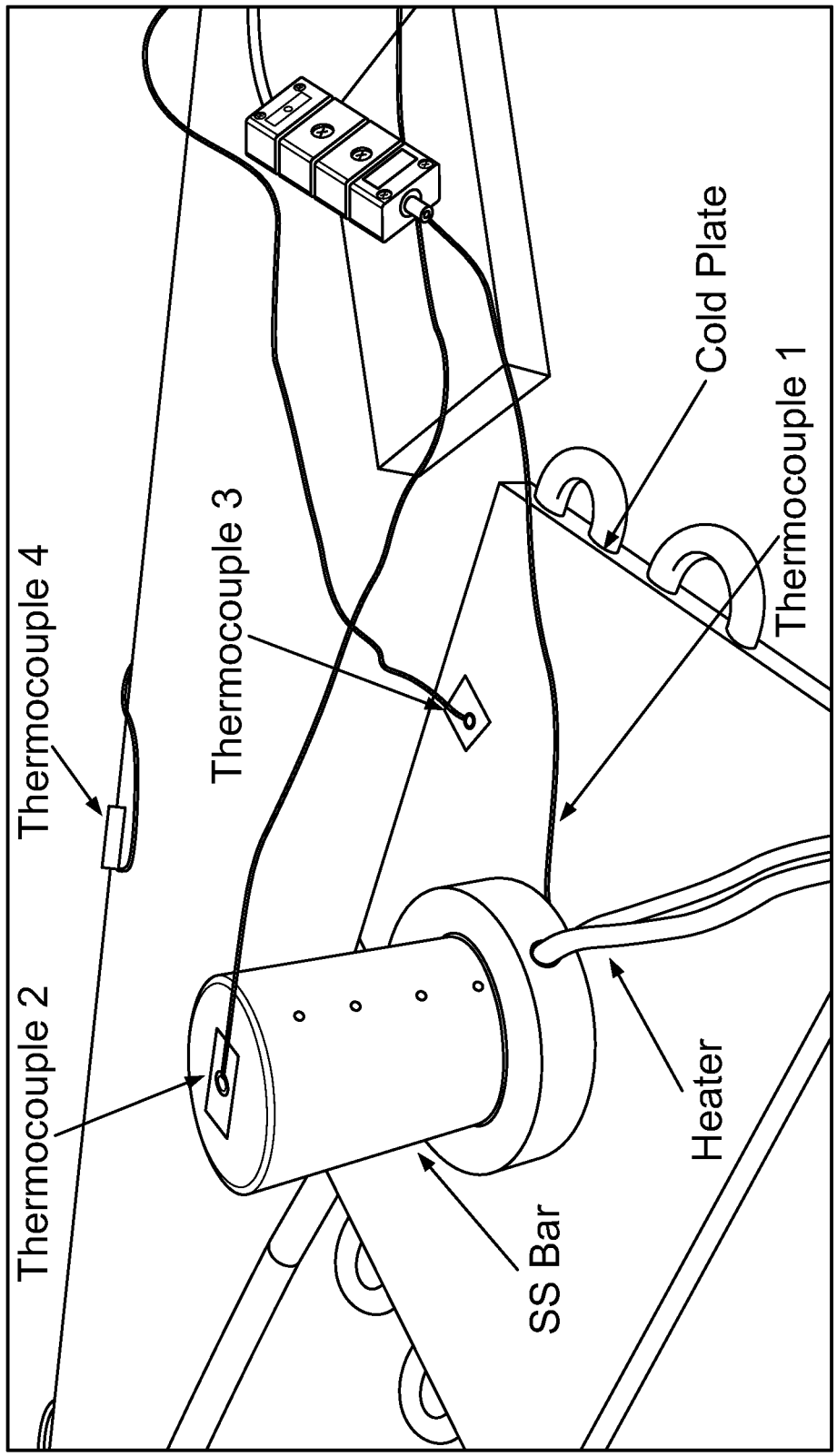
FIG. 1 illustrates an exemplary thermal testing vehicle setup including four thermocouples, a heater, a cold plate, and a stainless steel (SS) bar.

FIG. 1-7 relate to exemplary EV Battery TTV testing for a prototype 9 W/mK TIM made according to exemplary embodiments of the thermal management and/or EMI mitigation materials including coated functional filler as disclosed herein. More specifically, FIG. 1 illustrates an exemplary thermal testing vehicle setup including four thermocouples 1, 2, 3, and 4, a heater, a cold plate, and a stainless steel (SS) bar.

The first thermocouple 1 is configured for providing heat source temperature. The second thermocouple 2 is configured for providing top surface temperature of the SS bar. The third thermocouple 3 is configured for providing cold plate temperature. The fourth thermocouple 4 is configured for providing ambient temperature. During the testing, a power generator was used to generate 22 Watts (56 Volts, 0.4 Amps), and the cooler was used to control the fluid temperature in the cold plate to be around 20 degrees Celsius (° C.).

Figure 4:
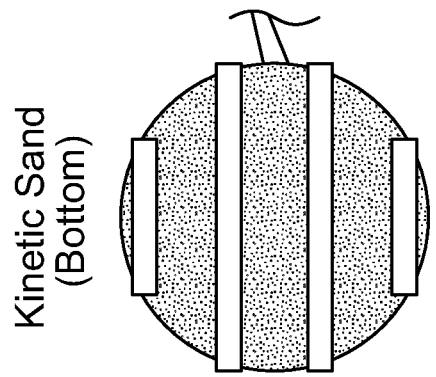
FIG. 4 illustrates a third test sample including aluminum strips and kinetic sand along the bottom of the SS bar shown in FIG. 1.
Figure 3:
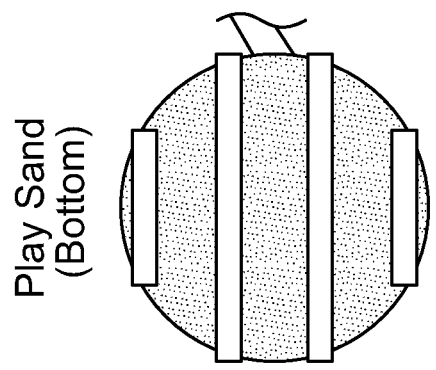
FIG. 3 illustrates a second test sample including aluminum strips and regular/play sand along the bottom of the SS bar shown in FIG. 1
Figure 2:
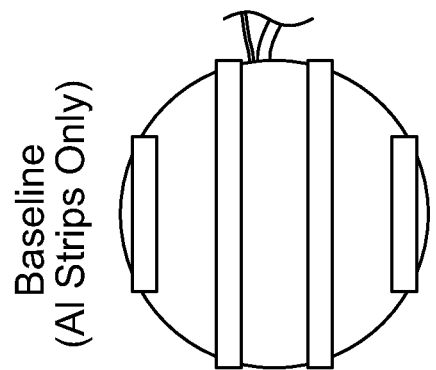
FIG. 2 illustrates a first or baseline test sample that includes aluminum strips only along the bottom of the SS bar shown in FIG. 1.

FIG. 2 illustrates a first or baseline test sample that includes aluminum strips only along a bottom of the SS bar. FIG. 3 illustrates a second test sample including regular/play sand along the bottom of the SS bar in addition to aluminum strips. FIG. 4 illustrates a third test sample including kinetic sand along the bottom of the SS bar in addition to aluminum strips. FIG. 5 illustrates a fourth test sample where the bottom of the SS bar included aluminum strips and a 9 W/mK thermal interface material (TIM) made according to exemplary embodiments of the thermal management and/or EMI mitigation materials including coated functional filler as disclosed herein.

FIGS. 6 and 7 include bar graphs of the test results for the four test samples shown in FIGS. 2-5. More specifically, FIG. 6 includes the heat source temperature comparison in degrees Celsius (° C.). FIG. 7 includes delta temperature (ΔT) in degrees Celsius (° C.) between the heat source and the top surface of the SS bar. FIGS. 6 and 7 also include test results for fifth, sixth, and seventh test samples. The fifth test sample included a modified second test sample (FIG. 3) in which regular/play sand was also along the side of the SS bar in addition to the regular/play sand and aluminum strips along the bottom of the SS bar. The sixth test sample included a modified third test sample (FIG. 4) in which kinetic sand was also along the side of the SS bar in addition to the kinetic sand and aluminum strips along the bottom of the SS bar. The seventh test sample included a modified fourth test sample (FIG. 5) in which the 9 W/mK TIM was also along the side of the SS bar in addition to the 9 W/mK TIM and aluminum strips along the bottom of the SS bar.

Generally, the testing results show a significant temperature drop (11.3° C.-42.8° C.) from the baseline (FIG. 2—aluminum strips only along the bottom of the SS bar) is observed by applying the three different materials between the aluminum strips along the bottom of the SS bar, i.e., regular/play sand (FIG. 3), kinetic sand (FIG. 4), and 9 W/mK TIM (FIG. 5). The testing results also show about 10° C. drop in the heat source temperature is obtained by also placing thermal materials on the side of the stainless steel bar in addition to the bottom of the stainless steel bar. Additionally, the testing results also show that thermal materials placed between the heat source and the cooling plate create a more uniform temperature profile of the stainless steel bar (smaller ΔT between the heat source and the top surface of the stainless steel bar), and that adding thermal interface materials on the side of the stainless steel bar does not seem to have significant influence on the temperature uniformity.

The contents of the FIGS. 1-7, however, are provided only for purposes of illustration and not for purposes of limitation as exemplary embodiments disclosed herein may be configured differently than what is disclosed in the figures. For example, exemplary embodiments disclosed herein may have a thermal conductivity that is higher or lower than 9 W/mK and/or may produce different test results than what is disclosed in FIGS. 6 and 7. Accordingly, exemplary embodiments disclosed herein should not be limited to only what is disclosed in the figures.

The thermal management and/or EMI mitigation materials disclosed herein may comprise thermal interface materials, EMI shielding materials (e.g., EMI suppression materials, electrically-conductive thermal insulators, EMI absorbers etc.), microwave absorbers (e.g., microwave absorbing elastomers, microwave absorbing foams, EMI/RF/microwave absorbers, etc.), combinations thereof, etc. As used herein, thermal management and/or EMI mitigation materials includes EMI mitigation materials that are operable for providing EMI mitigation but which may not be good thermal conductors, such as electrically-conductive thermal insulators, EMI absorbing/suppressing thermal insulators, microwave absorbing/suppressing thermal insulators, etc. Additionally, thermal management and/or EMI mitigation materials also include thermal interface materials that do not provide any EMI shielding, such as thermally-conductive dielectric materials, etc. Further, thermal management and/or EMI mitigation materials also include hybrid or combined thermal management and EMI mitigation materials that are operable for both EMI mitigation and thermal management, such as hybrid thermal/EMI absorbers, thermally-conductive microwave absorbers, hybrid absorber/thermal management materials usable for EMI mitigation, combined thermal interface and EMI shielding materials (e.g., thermally-conductive and electrically-conductive materials, thermally-conductive and EMI shielding/absorbing/suppressing materials, etc.), etc.

Exemplary embodiments may include a thermal management and/or EMI mitigation material having a high thermal conductivity (e.g., greater than 1 W/mK (watts per meter per Kelvin), at least 9 W/mK, etc.) depending on the particular functional filler particles and filler loading. These thermal conductivities are only examples as other embodiments may include a thermal management and/or EMI mitigation material with a thermal conductivity higher than 9 W/mK, less than 1 W/mK, or other values between 1 and 9 W/mk. Accordingly, aspects of the present disclosure should not be limited to any particular thermal management and/or EMI mitigation material as exemplary embodiments may include a wide range of thermal management and/or EMI mitigation materials.

In exemplary embodiments, a thermal management and/or EMI mitigation material (e.g., a thermal interface material, etc.) may be used to define or provide part of a thermally-conductive heat path from a heat source to a heat removal/dissipation structure or component. A thermal management and/or EMI mitigation material disclosed herein may be used, for example, to help conduct thermal energy (e.g., heat, etc.) away from a heat source (e.g., one or more batteries, a battery back, other heat source, etc.). A thermal management and/or EMI mitigation material may be positioned generally between a heat source and a heat removal/dissipation structure or component (e.g., a heat spreader, a heat sink, a heat pipe, a device exterior case or housing, etc.) to establish a thermal joint, interface, pathway, or thermally-conductive heat path along which heat may be transferred (e.g., conducted) from the heat source to the heat removal/dissipation structure or component. During operation, the thermal management and/or EMI mitigation material may then function to allow heat transfer (e.g., to conduct heat, etc.) from the heat source along the thermally-conductive path to the heat removal/dissipation structure or component. In exemplary embodiments in which the thermal management and/or EMI mitigation material is also an EMI absorber, the thermal management and/or EMI mitigation material may also be operable for absorbing a portion of the EMI incident upon the thermal management and/or EMI mitigation material.

Example embodiments of thermal management and/or EMI mitigation materials disclosed herein may be used with a wide range of heat sources, electronic devices, and/or heat removal/dissipation structures or components (e.g., a heat spreader, heat sink, heat pipe, device exterior case or housing, battery(ies), battery pack for an electric vehicle, etc.). A heat source may comprise one or more batteries, battery packs, other heat generating components or devices, etc. Generally, a heat source may comprise any component or device that has a higher temperature than the thermal management and/or EMI mitigation material or otherwise provides or transfers heat to the thermal management and/or EMI mitigation material regardless of whether the heat is generated by the heat source or merely transferred through or via the heat source. Accordingly, aspects of the present disclosure should not be limited to use with any single type of heat source, electronic device, heat removal/dissipation structure, etc.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purpose of illustration only and do not limit the scope of the present disclosure, as exemplary embodiments disclosed herein may provide all or none of the above mentioned advantages and improvements and still fall within the scope of the present disclosure.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The terminology used herein is for the purpose of describing particular example embodiments only and is not intended to be limiting. For example, when permissive phrases, such as "may comprise", "may include", and the like, are used herein, at least one embodiment comprises or includes such feature(s). As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally", "about", and "substantially" may be used herein to mean within manufacturing tolerances. Or for example, the term "about" as used herein when modifying a quantity of an ingredient or reactant of the invention or employed refers to variation in the numerical quantity that can happen through typical measuring and handling procedures used, for example, when making concentrates or solutions in the real world through inadvertent error in these procedures; through differences in the manufacture, source, or purity of the ingredients employed to make the compositions or carry out the methods; and the like. The term "about" also encompasses amounts that differ due to different equilibrium conditions for a composition resulting from a particular initial mixture. Whether or not modified by the term "about", the claims include equivalents to the quantities.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A thermal management and/or electromagnetic interference (EMI) mitigation material comprising filler and a coating on the filler, wherein the thermal management and/or EMI mitigation material is configured to be dispensable or pumpable and/or moldable such the thermal management and/or EMI mitigation material will temporarily hold a basic shape after being formed into the basic shape,
wherein the filler comprises particles coated with the coating that adhere to one another such that relatively small gaps or air pockets are defined between adjacent particles.

2. The thermal management and/or electromagnetic interference (EMI) mitigation material of claim 1, wherein the thermal management and/or EMI mitigation material is configured to be moldable such that the thermal management and/or EMI mitigation material will temporarily hold a basic shape after being molded into the basic shape.

3. The thermal management and/or electromagnetic interference (EMI) mitigation material of claim 1, wherein the thermal management and/or EMI mitigation material is configured to be dispensable such that the thermal management and/or EMI mitigation material will temporarily hold a basic shape after being formed into the basic shape.

4. The thermal management and/or electromagnetic interference (EMI) mitigation material of claim 1, wherein the thermal management and/or EMI mitigation material is configured to be pumpable such that the thermal management and/or EMI mitigation material will temporarily hold a basic shape after being formed into the basic shape.

5. The thermal management and/or electromagnetic interference (EMI) mitigation material of claim 1, wherein the filler has one or more properties of being thermally conductive, electrically conductive, dielectric absorbing, and/or electromagnetic wave absorbing.

6. The thermal management and/or electromagnetic interference (EMI) mitigation material of claim 1, wherein the filler comprises sand.

7. The thermal management and/or electromagnetic interference (EMI) mitigation material of claim 1, wherein:
the coating comprises a binder; and
the filler is coated with the binder.

8. A thermal management and/or electromagnetic interference (EMI) mitigation material comprising filler and a coating on the filler;
wherein the thermal management and/or EMI mitigation material is configured to be dispensable or pumpable and/or moldable such the thermal management and/or EMI mitigation material will temporarily hold a basic shape after being formed into the basic shape;
wherein the thermal management and/or EMI mitigation material comprises:
a matrix loaded with the filler coated with the coating; or
the filler comprises particles coated with the coating that adhere to one another such that relatively small gaps or air pockets are defined between adjacent particles;
wherein the coating comprises a binder, and the filler is coated with the binder; and wherein:
the filler is coated with a surface coating under the binder to improve adhesion with the binder; and/or
the binder comprises a hydroxyl-terminated polymer cross-linked by a cross-linking agent; and/or
the binder comprises silicone oil cross-linked by a boron cross-linking agent.

9. The thermal management and/or EMI mitigation material of claim 7, wherein:
the filler comprises filler particles that have one or more properties of being thermally conductive, electrically conductive, dielectric absorbing, and/or electromagnetic wave absorbing; and
the binder defines a thin layer coating along surfaces of the filler particles and having a thickness such that the thin layer coating does not significantly alter the thermally conductive, electrically conductive, dielectric absorbing, and/or electromagnetic wave absorbing property(ies) of the filler particles.

10. The thermal management and/or EMI mitigation material of claim 1, wherein:
the thermal management and/or EMI mitigation material has a thermal conductivity of at least 9 W/mK or more;
the thermal management and/or EMI mitigation material includes more than 85 vol % of the filler coated with the coating;
particle size of the filler is within a range from about 0.01 microns to about 1000 microns; and
the thermal management and/or EMI mitigation material has a Shore 00 hardness less than 85.

11. The thermal management and/or EMI mitigation material of claim 1, wherein the particles comprise one or more of:
thermally-conductive particles;
electrically-conductive particles;
electromagnetic wave absorbing particles;
dielectric absorbing particles;
particles that have two or more properties of being thermally conductive, electrically conductive, dielectric absorbing, and electromagnetic wave absorbing; or
particles having particle shapes including one or more of round, spherical, flakes, rods, irregular, granular, cubic, or aggregated.

12. A thermal management solution for one or more batteries and/or battery packs, the thermal management solution comprising a thermal management and/or EMI mitigation material that comprises filler and a coating on the filler;
wherein the thermal management and/or EMI mitigation material is configured to be dispensable or pumpable and/or moldable such the thermal management and/or EMI mitigation material will temporarily hold a basic shape after being formed into the basic shape;
wherein the thermal management and/or EMI mitigation material comprises:
a matrix loaded with the filler coated with the coating; or
the filler comprises particles coated with the coating that adhere to one another such that relatively small gaps or air pockets are defined between adjacent particles;
wherein the thermal management and/or EMI mitigation material is positionable along a surface predesignated for the one or more batteries and/or battery packs, whereby:
the thermal management and/or EMI mitigation material is operable as a thermal interface material defining or establishing at least part of a thermally-conductive heat transfer path along which heat is transferrable with a portion of the one or more batteries and/or battery packs when the portion of the one or more batteries and/or battery packs are positioned on the thermal management and/or EMI mitigation material; and
the thermal management and/or EMI mitigation material is operable as a fire suppressant if the one or more batteries and/or battery packs catch fire to thereby help suppress the fire and inhibit the fire from spreading.

13. A device comprising at least one thermal management and/or EMI mitigation material of claim 1, wherein:
the at least one thermal management and/or EMI mitigation material is positioned relative to, against, and/or adjacent one or more heat sources of the device and one or more heat removal/dissipation structures of the device such that the at least one thermal management and/or EMI mitigation material is operable for defining or establishing at least part of a thermally-conductive heat transfer path generally between the one or more heat sources and the one or more heat removal/dissipation structures along which heat is transferrable; and/or the at least one thermal management and/or EMI mitigation material is positioned relative to, against, and/or adjacent one or more components of the device such that the at least one thermal management and/or EMI mitigation material is operable for providing EMI mitigation for the one or more components of the device; and/or the at least one thermal management and/or EMI mitigation material is positioned relative to, against, and/or adjacent one or more components of the device such that the at least one thermal management and/or EMI mitigation material is operable as a fire suppressant if the one or more components catch fire, whereby the at least one thermal management and/or EMI mitigation material may be operable to help suppress the fire and inhibit the fire from spreading.

14. A method relating to a material composition including filler and suitable for use as a thermal management and/or EMI mitigation material, the method comprising coating the filler with a coating to thereby provide the material composition for the thermal management and/or EMI mitigation material that is configured to be dispensable or pumpable and/or moldable such the thermal management and/or EMI mitigation material will temporarily hold a basic shape after being formed into the basic shape,
wherein the filler comprises particles coated with the coating that adhere to one another such that relatively small gaps or air pockets are defined between adjacent particles.

15. The method of claim 14, wherein the particles comprise one or more of:
thermally-conductive particles;
electrically-conductive particles;
electromagnetic wave absorbing particles;
dielectric absorbing particles;
particles that have two or more properties of being thermally conductive, electrically conductive, dielectric absorbing, and electromagnetic wave absorbing; or
particles having particle shapes including one or more of round, spherical, flakes, rods, irregular, granular, cubic, or aggregated.

16. The method of claim 14, wherein the thermal management and/or EMI mitigation material is configured to be moldable such that the thermal management and/or EMI mitigation material will temporarily hold a basic shape after being molded into the basic shape.

17. The method of claim 14, wherein the thermal management and/or EMI mitigation material is configured to be dispensable such that the thermal management and/or EMI mitigation material will temporarily hold a basic shape after being formed into the basic shape.

18. The method of claim 14, wherein the thermal management and/or EMI mitigation material is configured to be pumpable such that the thermal management and/or EMI mitigation material will temporarily hold a basic shape after being formed into the basic shape.

19. The method of claim 14, wherein the filler has one or more properties of being thermally conductive, electrically conductive, dielectric absorbing, and/or electromagnetic wave absorbing.

20. The method of claim 14, wherein the filler comprises sand.

21. A method relating to thermal management of one or more batteries and/or battery packs, the method comprising positioning a thermal interface material including filler coated with a coating along a surface predesignated for the one or more batteries and/or battery packs, wherein the thermal interface material is configured to be dispensable or pumpable and/or moldable such that the thermal interface material will temporarily hold a basic shape after being formed into the basic shape, and wherein:
the method includes loading a matrix with the filler coated with the coating; or
the filler comprises particles coated with the coating that adhere to one another such that relatively small gaps or air pockets are defined between adjacent particles.

22. The method of claim 21, wherein the filler comprises particles coated with the coating that adhere to one another such that the relatively small gaps or air pockets are defined between adjacent particles, and wherein the particles comprise one or more of:
thermally-conductive particles;
electrically-conductive particles;
electromagnetic wave absorbing particles;
dielectric absorbing particles;
particles that have two or more properties of being thermally conductive, electrically conductive, dielectric absorbing, and electromagnetic wave absorbing; or
particles having particle shapes including one or more of round, spherical, flakes, rods, irregular, granular, cubic, or aggregated.

23. The method of claim 21, wherein positioning the thermal interface material includes positioning the thermal interface material along a surface predesignated for a battery pack of an electric vehicle, whereby:
the thermal interface material is operable for defining or establishing at least part of a thermally-conductive heat transfer path along which heat is transferrable generally between a portion of the battery pack and the surface predesignated for the battery pack when the portion of the battery pack is positioned on the thermal interface material; and
the thermal interface material is operable as a fire suppressant if the battery pack catches fire to thereby help suppress the fire and inhibit the fire from spreading.

24. The method of claim 21, wherein the filler comprises particles coated with the coating, and wherein the method includes:
leveling, flattening, or smoothing out the particles coated with the coating along the surface predesignated for the one or more batteries and/or battery packs before placement of the one or more batteries and/or battery packs on the particles coated with the coating; and/or
dispensing more particles coated with the coating along the surface predesignated for the one or more batteries and/or battery packs before placement of the one or more batteries and/or battery packs on the particles coated with the coating.

25. The method of claim 21, wherein the thermal management and/or EMI mitigation material is configured to be moldable such that the thermal management and/or EMI mitigation material will temporarily hold a basic shape after being molded into the basic shape.

26. The method of claim 21, wherein the thermal management and/or EMI mitigation material is configured to be dispensable such that the thermal management and/or EMI mitigation material will temporarily hold a basic shape after being formed into the basic shape.

27. The method of claim 21, wherein the thermal management and/or EMI mitigation material is configured to be pumpable such that the thermal management and/or EMI mitigation material will temporarily hold a basic shape after being formed into the basic shape.

28. The method of claim 21, wherein the filler has one or more properties of being thermally conductive, electrically conductive, dielectric absorbing, and/or electromagnetic wave absorbing.

29. The method of claim 21, wherein the filler comprises sand coated with the coating.

\* \* \* \* \*